US009177922B2

(12) United States Patent
Takeda et al.

(10) Patent No.: US 9,177,922 B2
(45) Date of Patent: Nov. 3, 2015

(54) ELECTRIC DEVICE, METHOD FOR MANUFACTURING THE SAME, AND RADIATION INSPECTION APPARATUS

(71) Applicant: CANON KABUSHIKI KAISHA, Tokyo (JP)

(72) Inventors: Shinichi Takeda, Honjo (JP); Masato Inoue, Kumagaya (JP); Satoru Sawada, Fujioka (JP); Takamasa Ishii, Honjo (JP); Taiki Takei, Yokohama (JP); Kota Nishibe, Honjo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/291,126

(22) Filed: May 30, 2014

(65) Prior Publication Data

US 2014/0361183 A1    Dec. 11, 2014

(30) Foreign Application Priority Data

Jun. 5, 2013  (JP) ................................ 2013-119211

(51) Int. Cl.

| G01T 1/24 | (2006.01) |
|---|---|
| H01L 23/00 | (2006.01) |
| H01L 27/146 | (2006.01) |
| H01L 21/768 | (2006.01) |
| G01T 1/20 | (2006.01) |

(52) U.S. Cl.
CPC ............ *H01L 23/564* (2013.01); *G01T 1/2018* (2013.01); *H01L 21/76877* (2013.01); *H01L 27/14634* (2013.01); *H01L 27/14636* (2013.01); *H01L 27/14663* (2013.01); *H01L 27/14676* (2013.01)

(58) Field of Classification Search
CPC .. H01L 23/585; H01L 21/76834; G01T 1/241
See application file for complete search history.

(56) References Cited

U.S. PATENT DOCUMENTS

| 2002/0000549 A1* | 1/2002 | Spartiotis et al. ............... 257/21 |
| 2010/0237452 A1* | 9/2010 | Hagiwara et al. ............. 257/432 |
| 2010/0264507 A1* | 10/2010 | Takahashi et al. ............ 257/491 |

FOREIGN PATENT DOCUMENTS

| JP | 2000-066241 A | 3/2000 |
| JP | 2009-181095 A | 8/2000 |

* cited by examiner

*Primary Examiner* — Kiho Kim
*Assistant Examiner* — Kenneth J Malkowski
(74) *Attorney, Agent, or Firm* — Carter, DeLuca, Farrell & Schmidt, LLP

(57) ABSTRACT

An electric device, comprising a conductive guard ring formed on a substrate along an outer periphery of the substrate, an electrode formed inside the guard ring on the substrate, and a connecting portion formed above the electrode, for connecting an external apparatus and the electrode, wherein the connecting portion includes a conductive member for electrically connecting the external apparatus and the electrode, and an insulating member formed on a lower surface of the conductive member, and the insulating member exposes a portion of the conductive member, which is positioned immediately above the electrode, and an end of the insulating member is positioned inside the guard ring in planar view such that the conductive member and the guard ring do not contact each other.

9 Claims, 6 Drawing Sheets

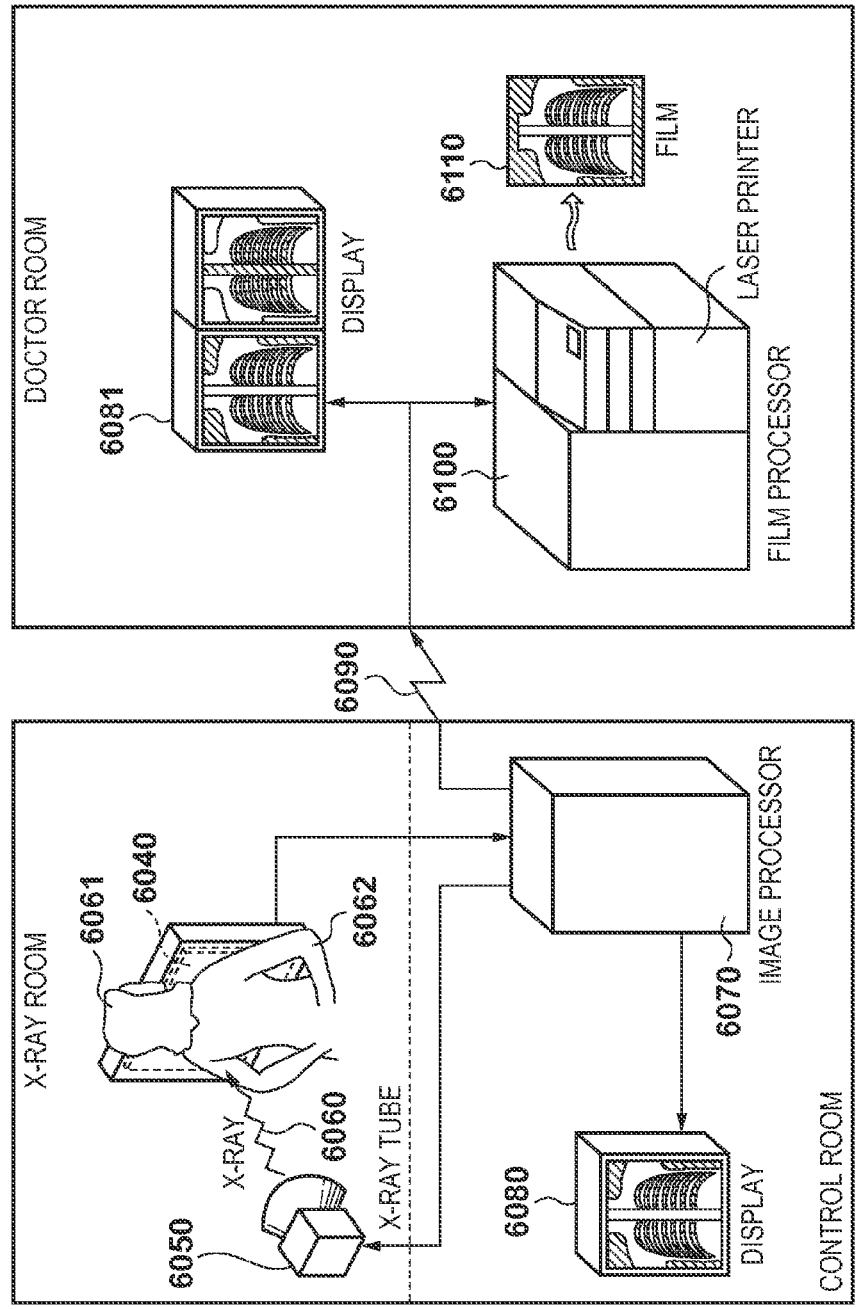

ELECTRIC DEVICE, METHOD FOR MANUFACTURING THE SAME, AND RADIATION INSPECTION APPARATUS

BACKGROUND OF THE INVENTION

1. Field of the Invention

The present invention relates to an electric device, a method for manufacturing the same, and a radiation inspection apparatus.

2. Description of the Related Art

In an electric device formed by mounting an electronic component on a substrate, a conductive guard ring is formed along the outer periphery of the substrate. The substrate of the electric device includes a connecting portion (for example, a flexible printed board) for connecting the electric device and an external apparatus. This connecting portion must be attached to the substrate of the electric device so that the guard ring and connecting portion on the substrate do not short.

Japanese Patent Laid-Open No. 2000-66241 has disclosed a liquid crystal panel substrate including a guard ring covered with an insulating member, and disclosed a structure in which a connecting portion for connecting the liquid crystal panel substrate and an external apparatus is formed on the insulating member. Japanese Patent Laid-Open No. 2009-181095 has disclosed a structure in which in the vicinity of an electrode region where an electrode is formed, a guard ring is formed in a region inside the electrode region in order to prevent damages to an insulating member covering the guard ring when a connecting portion is attached.

In the structure disclosed in Japanese Patent Laid-Open No. 2000-66241, the guard ring is covered with the insulating member, but the insulating member may be damaged when the connecting portion is attached to the substrate. Also, the structure disclosed in Japanese Patent Laid-Open No. 2009-181095 cannot easily be manufactured because the guard ring must be formed in accordance with the position of the electrode region.

SUMMARY OF THE INVENTION

The present invention provides an electric device so configured as not to short a guard ring and connecting portion on a substrate, and advantageous in respect of the manufacture.

One of the aspects of the present invention provides an electric device, comprising a conductive guard ring formed on a substrate along an outer periphery of the substrate, an electrode formed inside the guard ring on the substrate, and a connecting portion, which is formed above the electrode, for connecting an external apparatus and the electrode, wherein the connecting portion includes a conductive member for electrically connecting the external apparatus and the electrode, and an insulating member formed on a lower surface of the conductive member, and the insulating member exposes a portion of the conductive member, which is positioned immediately above the electrode, and an end of the insulating member is positioned inside the guard ring in planar view such that the conductive member and the guard ring do not contact each other.

Further features of the present invention will become apparent from the following description of exemplary embodiments with reference to the attached drawings.

BRIEF DESCRIPTION OF THE DRAWINGS

FIG. 4 is a view for explaining an example of application to a radiation imaging system.

DESCRIPTION OF THE EMBODIMENTS

In each embodiment below, the present invention will be described by taking a radiation imaging apparatus as a typical example of an electric device. The radiation imaging apparatus can include a sensor panel in which a plurality of sensors for detecting radiation are arranged on a substrate. The sensor panel can take, for example, a so-called indirect conversion type arrangement including a scintillator for converting radiation into light, and a photoelectric conversion element for detecting the light. Note that the scintillator can be formed by using, for example, a member obtained by doping Tl in CsI or a member obtained by doping Tb in GdOS, and the photoelectric conversion element can be formed by using, for example, amorphous silicon. The sensor panel may also take a so-called direct conversion type arrangement in which a photoelectric conversion element directly converts radiation into an electrical signal. This photoelectric conversion element can be formed by using, for example, amorphous selenium.

First Embodiment

Figure 1A:
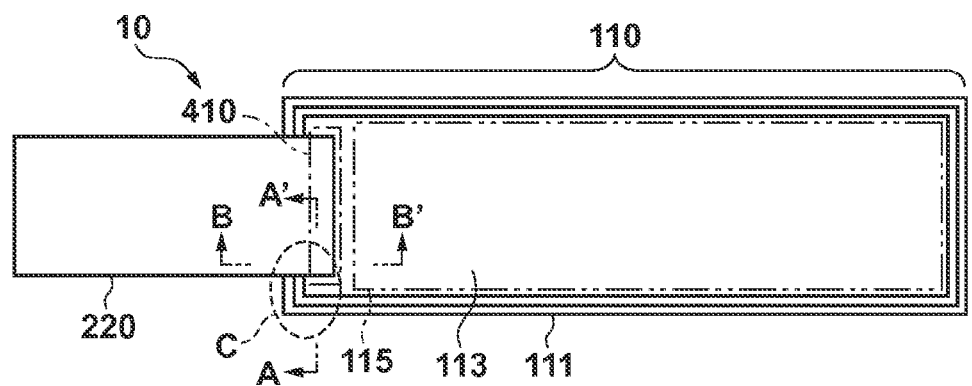
FIGS. 1A to 1D are views for explaining a configuration example of a radiation imaging apparatus of the first embodiment.
Figure 1B:
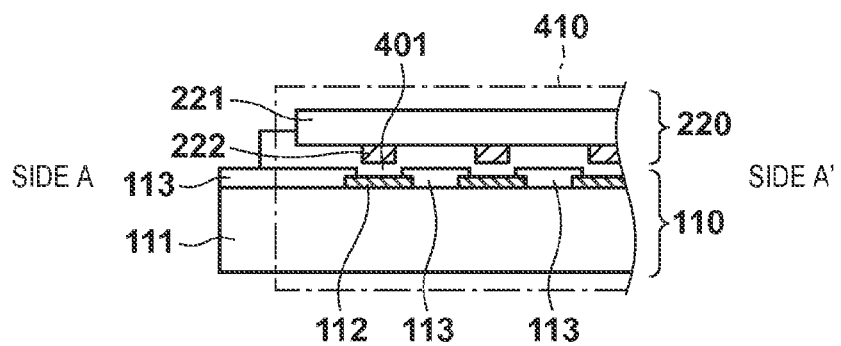
Figure 1C:
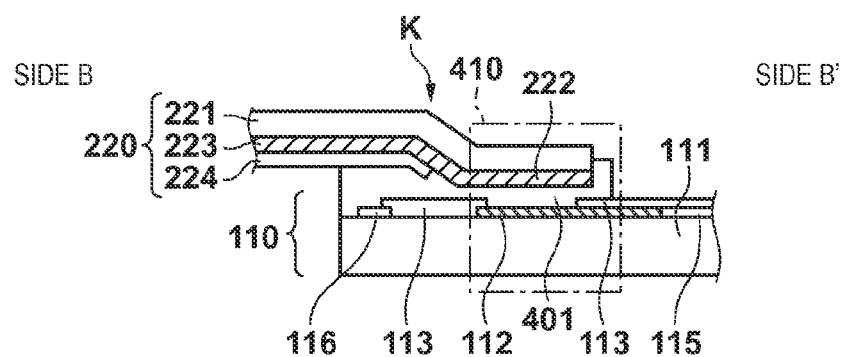
Figure 1D:
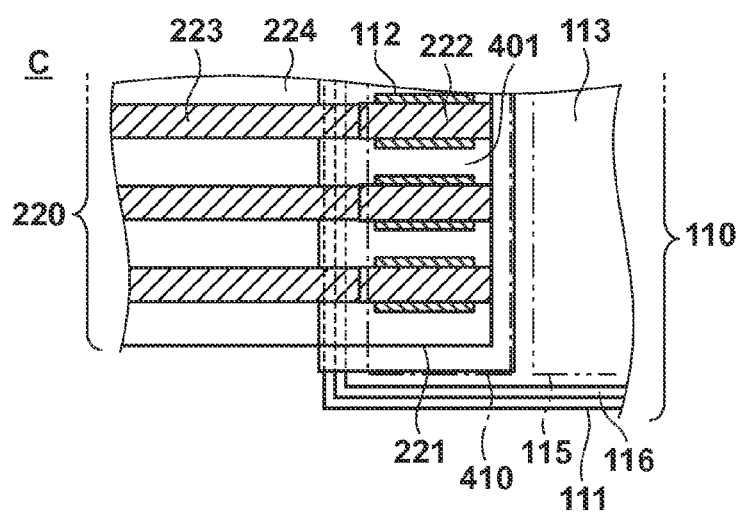

A radiation imaging apparatus 10 (to be referred to as the "apparatus 10" hereinafter) according to the first embodiment will be explained with reference to FIGS. 1A to 1D. FIGS. 1A to 1D schematically show a configuration example of the apparatus 10. FIG. 1A is a plan view of the overall arrangement of the apparatus 10. FIG. 1B shows a sectional structure taken along a cut line A-A' shown in FIG. 1A. FIG. 1C shows a sectional structure taken along a cut line B-B' shown in FIG. 1A. FIG. 1D is an enlarged view of a region C shown in FIG. 1A.

As shown in FIGS. 1B and 1C, the apparatus 10 can include a sensor panel 110, and a flexible printed board 220 corresponding to a connecting portion. The sensor panel 110 includes an imaging region 115 where a sensor array is formed on a substrate 111 made of a semiconductor such as silicon, a guard ring 116 formed along the outer periphery of the substrate 111, and an electrode 112 formed between the imaging region 115 and guard ring 116. A single-crystal silicon substrate or the like can preferably be used as the substrate 111. The electrode 112 can include an electrode for receiving a control signal for reading out a signal from each sensor, and a power supply electrode, in addition to an electrode for outputting a signal read out from each sensor. A protective film 113 for protecting the sensor array is formed on the sensor panel 110 so as to expose the electrode 112. The protective film 113 is formed by using, for example, silicon oxide or silicon nitride, and has a moisture-proof function for elements such as sensors, wiring patterns, and the like.

The guard ring 116 is formed on the substrate 111 by using a conductive member such as aluminum. For example, in a manufacturing method of obtaining a plurality of sensor panels from one large substrate, the sensor panels 110 are cut out by dicing from the large substrate in the final stage. The guard ring 116 can prevent the sensor panel 110 from being destructed by mechanical damages that can occur during this dicing or by static electricity. Also, the guard ring 116 can have a moisture-proof function of preventing the penetration of water from the side surfaces (dicing surfaces) of the substrate 111.

As shown in FIG. 1C, the flexible printed board 220 includes a base member 221, wiring portion 223, and cover 224, and can be formed above the electrode 112. The base member 221 supports the wiring portion 223 and cover 224. The wiring portion 223 is made of a conductive member such as copper or aluminum, and electrically connects an external apparatus and the electrode 112. The cover 224 is made of an insulating member, and covers the lower surface of the wiring portion 223 such that a part of the wiring portion 223 is exposed and the wiring portion 223 and guard ring 116 do not contact each other. The cover 224 can be formed by, for example, print coating using an organic film of, for example, an epoxy resin or polyimide, or a resin, or lamination using a film-like sheet as an adhesive. Also, the wiring portion 223 includes a portion exposed immediately above the electrode 112 (a portion having a lower surface uncovered with the cover 224) as an electrode 222. The flexible printed board 220 may also include a folding portion K between the guard ring 116 and electrode 112 in planar view with respect to the upper surface of the substrate 111, so that the lower surface of the electrode 222 is positioned below the lower surface of the cover 224.

Also, as shown in FIG. 1C, the electrodes 112 and 222 are electrically connected by an anisotropic conductive member 401 (for example, ACF (Anisotropic Conductive Film)).

The anisotropic conductive member 401 is formed by mixing conductive particles in a thermosetting resin, and the particles are spheres each including a nickel layer, gold plating layer, and insulating layer in this order from the inside and having a diameter of about 3 to 5 μm. When the two electrodes are pressed as they are heated by a heater or the like with the anisotropic conductive member 401 being interposed between them, the particles form a conductive path by the plating layers inside the particles, thereby electrically connecting the two electrodes. On the other hand, an insulated state is maintained in a non-pressed portion.

In this embodiment, the anisotropic conductive member 401 is thermocompressively bonded in a connecting region 410, thereby adhering and electrically connecting the electrodes 112 and 222, and has insulation properties in other regions (for example, a region above the guard ring 116). The thermocompression bonding of the anisotropic conductive member 401 can be performed by, for example, performing heating at about 200° C. and pressing at a few MPa. The above-described thermocompression bonding can properly be performed because the lower surface of the electrode 222 is positioned below the lower surface of the cover 224. Note that a plurality of electrodes 112 are arranged as shown FIG. 1B, and the anisotropic conductive member 401 has insulation properties between adjacent electrodes 112, and electrically connects each electrode 112 and the electrode 222 immediately above the electrode 112.

As shown in FIG. 1C, the end (or edge) of the cover 224 covering the lower surface of the wiring portion 223 is positioned inside the guard ring 116 and outside the electrode 112 in planar view with respect to the upper surface of the substrate 111. Also, the guard ring 116 is positioned outside the connecting region 410 where thermocompression bonding is performed. In the vicinity of the guard ring 116, the anisotropic conductive member 401 adheres and fixes the flexible printed board 220 and sensor panel 110 to each other while maintaining the insulated state.

In the above arrangement, the wiring portion 223 and guard ring 116 are insulated from each other, and the electrode 222 of the wiring portion 223 and the electrode 112 are electrically connected. Also, since the lower surface of the electrode 222 is positioned below the lower surface of the cover 224, the electrodes 112 and 222 are properly thermocompressively bonded, and hence can electrically be connected as they are effectively adhered to each other. In addition, since the end of the cover 224 is positioned in the folding portion K, it is possible to effectively insulate the wiring portion 223 and guard ring 116 from each other, and effectively electrically connect the electrodes 222 and 112. In this embodiment, therefore, it is readily possible to attach the flexible printed board 220 to the sensor panel 110 so as not to short the flexible printed board 220 and guard ring 116. This makes the embodiment advantageous in respect of the manufacture of the apparatus 10.

Note that when attaching the flexible printed board 220 to the sensor panel 110, the guard ring 116 may be covered with the above-described protective film 113 or an insulating member, and may also be exposed. When the guard ring 116 is exposed, the potential of the guard ring 116 can be fixed by, for example, another portion of the flexible printed board 220 in the connecting region 410. For example, it is possible to further form a second wiring portion (not shown) on the lower surface side of the cover 224, and electrically connect the second wiring portion and guard ring 116. This arrangement can prevent the apparatus 10 from taking an electrical charge, or reduce the substrate noise.

Second Embodiment

A radiation imaging apparatus 20 according to the second embodiment will be explained with reference to FIGS. 2A to 2D. FIGS. 2A to 2D schematically show a configuration example of the radiation imaging apparatus 20 (to be referred to as the "apparatus 20" hereinafter), and respectively correspond to FIGS. 1A to 1D. This embodiment differs from the first embodiment in that no folding portion K is formed in a flexible printed board 230.

Figure 2A:
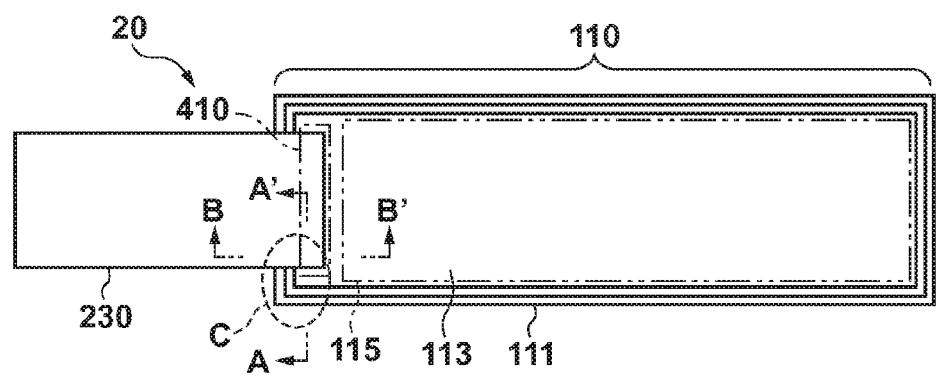
FIGS. 2A to 2D are views for explaining a configuration example of a radiation imaging apparatus of the second embodiment.
Figure 2B:
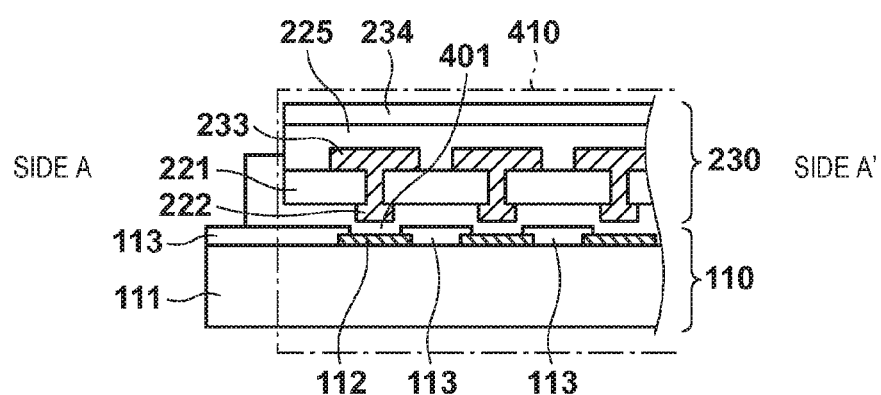
Figure 2C:
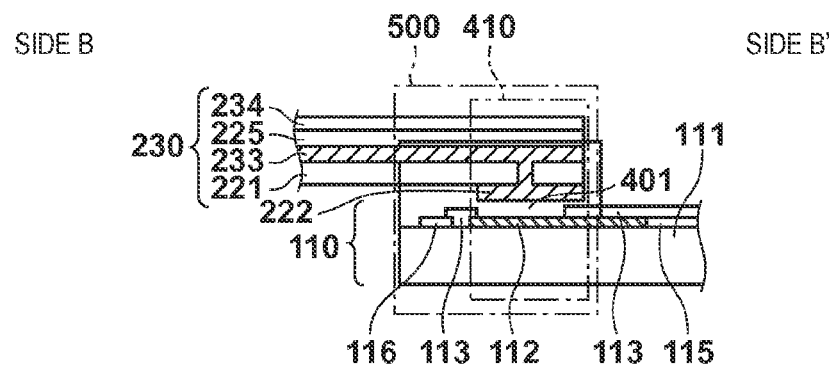
Figure 2D:
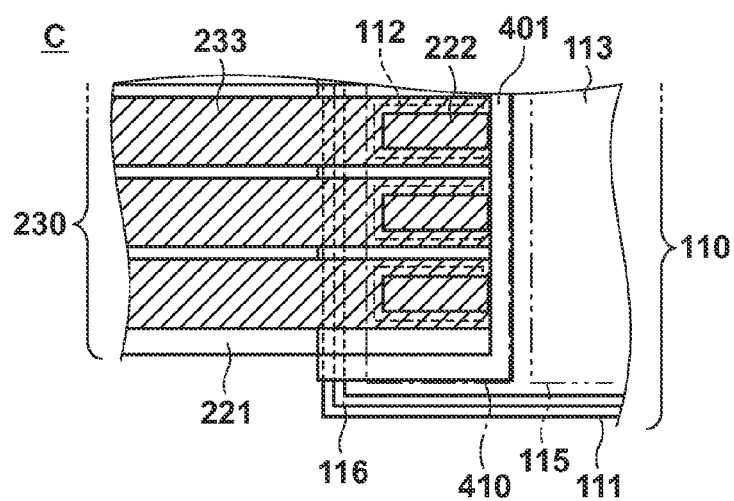

In this embodiment, an electrode 222 can be formed by preparing a base member 221 made of an insulating member, forming metal layers made of copper or the like on the two surfaces of the base member 221, and patterning one of the two metal layers formed on the two surfaces. The two metal layers formed on the two surfaces of the base member 221 can be connected to each other by a conductive member in an opening formed in the base member 221. Also, a cover 234 can be so formed as to cover the other one of the two metal layers with, for example, an adhesive material 225 being interposed between them. In this arrangement, as shown in FIG. 2C, the electrode 222 can be so formed as to protrude to be lower than the lower surface of the base member 221.

As in the first embodiment, an electrode 112 of a sensor panel 110 and the electrode 222 can electrically be connected as they are adhered to each other by thermocompression bonding with an anisotropic conductive member 401 being interposed between them. This thermocompression bonding can be performed in a region 500 as shown in FIG. 2C.

In this embodiment, the electrode 222 is formed by patterning one of the two metal layers, that is, the electrode 222 protrudes to be lower than the lower surface of the base member 221, so it is unnecessary to form the folding portion K unlike in the first embodiment. In the arrangement of this embodiment, the distance from a guard ring 116 to the electrode 222 in planar view with respect to the upper surface of a substrate 111 can be set to about 0.1 mm by taking account of an alignment error, while this distance is, for example, about 0.5 to 1.0 mm in the first embodiment. Accordingly, this embodiment can achieve the same effect as that of the first embodiment, and can also form a region for connecting the flexible printed board 230 and sensor panel 110 with an area smaller than that in the first embodiment. This is advantageous in downsizing the apparatus 20.

Also, when the guard ring 116 is exposed in the apparatus 20, the potential of the guard ring 116 formed on the substrate 111 can easily be fixed by, for example, another portion of the flexible printed board 230 in a connecting region 410. For example, it is possible to further form a second wiring portion (not shown) on the lower surface side of the base member 221, and electrically connect the second wiring portion and guard ring 116. This arrangement can, for example, prevent the apparatus 20 from taking an electrical charge, or reduce the substrate noise. The second wiring portion can be formed together with the electrode 222 by patterning for forming the electrode 222.

(Example of Application to Large Sensor Panel)

An embodiment in which a large sensor panel is formed by using the apparatus 10 or 20 described in each of the above embodiments will be described below with reference to FIGS. 3A and 3B. A method of forming a large sensor panel by using a plurality of apparatuses 10 will be exemplified in this embodiment, but the method similarly applies even when using the apparatus 20.

Figure 3A:
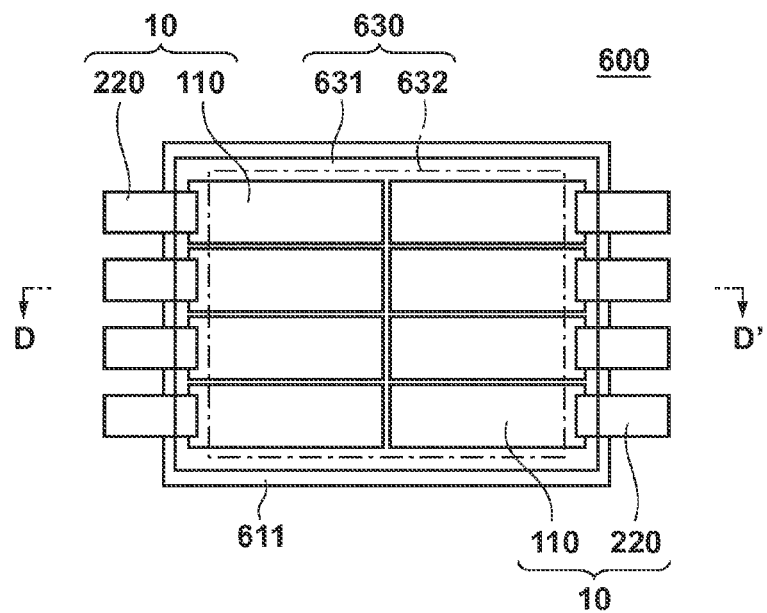
FIGS. 3A and 3B are views for explaining an example of application to a large sensor panel.
Figure 3B:
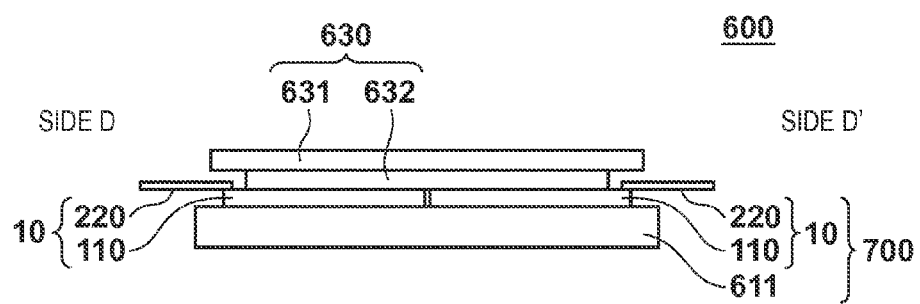

FIGS. 3A and 3B schematically show a configuration example of an indirect conversion type radiation imaging apparatus 600 (to be referred to as the "apparatus 600" hereinafter). FIG. 3A is a plan view of the overall arrangement of the apparatus 600. FIG. 3B shows a sectional structure taken along a cut line D-D' shown in FIG. 3A.

As exemplified in FIGS. 3A and 3B, the apparatus 600 forms a large sensor panel 700 by arranging a plurality of apparatuses 10 on a base 611 made of glass or the like. The apparatuses 10 can be arranged on the base 611 by using, for example, a pressure sensitive adhesive or adhesive. A scintillator panel 630 is placed on the large sensor panel 630 as exemplified in FIG. 3B.

The scintillator panel 630 includes a base 631 made of, for example, amorphous carbon or aluminum, and a scintillator 632 formed on one surface of the base 631. The scintillator panel 630 is placed on the large sensor panel 700 by using, for example, a pressure sensitive adhesive or adhesive, so that the surface on which the scintillator 632 is formed is close to the sensor side of each apparatus 10. The scintillator 632 can be formed on the base 631 by using, for example, a phosphor (for example, CsI:Tl, CsI:Na, or CsBr:Tl) mainly containing alkali halide. As an example, CsI:Tl can be formed by simultaneously vapor-depositing CsI and Tl.

In the apparatus 600, radiation having entered the scintillator 632 from the side of the base 631 is converted into visible light by the scintillator 632, and an electrical signal based on the amount of light is obtained by the sensor panel 110 of each apparatus 10. The electrical signal thus obtained can be read out to an external apparatus via a flexible printed board 220, and radiation image data can be formed through predetermined signal processing.

(Example of Application to Radiation Imaging System)

The above-described radiation imaging apparatus is applicable to an imaging system such as a radiation inspection apparatus. The imaging system includes, for example, an imaging apparatus, a signal processing unit including an image processor and the like, a display unit including a display and the like, and a radiation source for generating radiation. Note that the radiation includes particle beams such as X-rays, α-rays, β-rays, γ-rays, cosmic rays, and electromagnetic waves.

In a typical imaging system example, as shown in FIG. 4, X-rays 6060 generated in an X-ray tube 6050 are transmitted through a chest 6062 of an object 6061 such as a patient, and enter an imaging apparatus 6040. The incident X-rays 6060 contain information of the interior of the body of the object 6061. The imaging apparatus 6040 obtains electrical information corresponding to the incident X-rays 6060. After that, this information can be converted into digital data, an image processor 6070 (the signal processing unit) can perform image processing on the digital data, and a display 6080 (the display unit) of a control room can display the data as an examination result. This information can also be transferred to a remote place by a network 6090 (transmission processing means) such as a telephone, a LAN, or the Internet. Consequently, the information can be displayed as an inspection result on a display 6081 in another place such as a doctor room, and a doctor in a remote place can perform diagnosis. The information and inspection result can also be saved on an optical disk or the like, or recorded on a recording medium such as a film 6110 by a film processor 6100.

The present invention is not limited to these embodiments, can be changed as needed in accordance with the purpose, state, application, function, and other specifications, and can also be carried out by another embodiment. For example, a glass substrate can be used as the substrate 111 instead of a semiconductor substrate. Note that the present invention has been explained by taking a radiation imaging apparatus as an example of the electric device, but the concept of the electric device can include a liquid crystal display device such as a liquid crystal panel and other electronic apparatuses.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-119211, filed Jun. 5, 2013, which is hereby incorporated by reference herein in its entirety.

What is claimed is:

1. An electric device, comprising:
a conductive guard ring formed on a substrate along an outer periphery of the substrate;
an electrode formed inside the guard ring on the substrate; and
a connecting portion, which is formed above the electrode, for connecting an external apparatus and the electrode,
wherein the connecting portion includes a conductive member for electrically connecting the external apparatus and the electrode, and an insulating member formed on a lower surface of the conductive member, and
the insulating member exposes a portion of the conductive member, which is positioned immediately above the electrode, and an end of the insulating member is positioned inside the guard ring in planar view such that the conductive member and the guard ring do not contact each other.

2. The device according to claim 1, further comprising an anisotropic conductive member arranged between the substrate and the connecting portion,
wherein the conductive member and the electrode are electrically connected by thermocompression bonding of a portion of the anisotropic conductive member, which is positioned immediately above the electrode.

3. The device according to claim 1, wherein the connecting portion includes a folding portion between the guard ring and the electrode in planar view, such that a lower surface of the portion of the conductive member, which is positioned immediately above the electrode, is positioned below a lower surface of the insulating member.

4. The device according to claim 3, wherein the end of the insulating member is positioned in the folding portion.

5. The device according to claim 1, wherein the insulating member has an opening, and the portion of the conductive member, which is positioned immediately above the electrode, protrudes from the opening to be lower than a lower surface of the insulating member.

6. The device according to claim 1, wherein the connecting portion further includes a second conductive member formed below the insulating member, and the second conductive member is electrically connected to the guard ring.

7. The device according to claim 1, further comprising a radiation imaging apparatus,
wherein the substrate includes a sensor array in which a plurality of sensors configured to detect radiation are arranged, and the connecting portion is connected to the sensor array via the electrode.

8. A radiation inspection apparatus comprising:
an electric device cited in claim 7 including a radiation imaging apparatus; and
a radiation source configured to generate radiation.

9. A method for manufacturing an electric device comprising a conductive guard ring formed on a substrate along an outer periphery of the substrate, and an electrode formed inside the guard ring on the substrate, comprising:
forming a connecting portion for connecting an external apparatus and the electrode by forming an insulating member on a lower surface of a conductive member such that a portion of the conductive member is exposed; and
attaching the connecting portion to the substrate,
wherein in the attaching the connecting portion to the substrate, the connecting portion is attached to the substrate such that the exposed portion of the conductive member and the electrode are electrically connected, and the conductive member and the guard ring do not contact each other because an end of the insulating member is positioned inside the guard ring in planar view.

* * * * *